(12) United States Patent
Frougier et al.

(10) Patent No.: US 10,832,954 B2
(45) Date of Patent: Nov. 10, 2020

(54) FORMING A RELIABLE WRAP-AROUND CONTACT WITHOUT SOURCE/DRAIN SACRIFICIAL REGIONS

(71) Applicant: International Business Machines Corporation, Armonk, NY (US)

(72) Inventors: Julien Frougier, Albany, NY (US); Kangguo Cheng, Schenectady, NY (US); Ruilong Xie, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/363,349

(22) Filed: Mar. 25, 2019

(65) Prior Publication Data

US 2020/0312980 A1    Oct. 1, 2020

(51) Int. Cl.
| | | |
|---|---|---|
| *H01L 21/8234* | (2006.01) | |
| *H01L 29/66* | (2006.01) | |
| *H01L 29/06* | (2006.01) | |
| *H01L 29/417* | (2006.01) | |
| *H01L 29/78* | (2006.01) | |
| *H01L 21/02* | (2006.01) | |
| *H01L 29/423* | (2006.01) | |

(52) U.S. Cl.
CPC .......... *H01L 21/823418* (2013.01); *H01L 21/02603* (2013.01); *H01L 29/0653* (2013.01); *H01L 29/0669* (2013.01); *H01L 29/41733* (2013.01); *H01L 29/42384* (2013.01); *H01L 29/6681* (2013.01); *H01L 29/785* (2013.01); *H01L 2029/7858* (2013.01)

(58) Field of Classification Search
CPC ....... H01L 2029/7858; H01L 29/41791; H01L 29/41741; H01L 29/41783; H01L 21/823418; H01L 21/823814; H01L 21/823475; H01L 21/823871; H01L 29/0669; H01L 29/0673
See application file for complete search history.

(56) References Cited

U.S. PATENT DOCUMENTS

| | | | |
|---|---|---|---|
| 8,778,768 B1 | 7/2014 | Chang et al. | |
| 9,245,885 B1* | 1/2016 | Xie | ...................... H01L 27/0886 |
| (Continued) | | | |

OTHER PUBLICATIONS

N. Loubet et al., "Stacked nanosheet gate-all-around transistor to enable scaling beyond FinFET," Symposium on VLSI Technology, 2017, pp. T230-T231.

*Primary Examiner* — Scott B Geyer
(74) *Attorney, Agent, or Firm* — Cantor Colburn LLP; Joe Petrokaitis

(57) ABSTRACT

Embodiments of the present invention are directed to forming a reliable wrap-around contact (WAC) without using a source/drain sacrificial region. In a non-limiting embodiment of the invention, an isolation structure is formed over a substrate. A source or drain (S/D) region is formed over the substrate and between sidewalls of the isolation structure. A liner is formed over the S/D region and a sacrificial region is formed over the liner. The sacrificial region can be recessed below a surface of the isolation structure and an interlayer dielectric can be formed over the recessed surface of the sacrificial region. The sacrificial region can be replaced with a wrap-around contact.

16 Claims, 15 Drawing Sheets

(56) References Cited

U.S. PATENT DOCUMENTS

| | | | |
|---|---|---|---|
| 9,653,287 B2 | 5/2017 | Rodder et al. | |
| 9,847,390 B1 * | 12/2017 | Xie | H01L 29/0673 |
| 10,192,867 B1 * | 1/2019 | Frougier | H01L 29/66545 |
| 10,276,442 B1 * | 4/2019 | Xie | H01L 29/41725 |
| 10,367,077 B1 * | 7/2019 | Loubet | H01L 29/0653 |
| 2011/0147840 A1 | 6/2011 | Cea et al. | |
| 2011/0298058 A1 | 12/2011 | Kawasaki et al. | |
| 2014/0001520 A1 | 1/2014 | Glass et al. | |
| 2014/0209855 A1 | 7/2014 | Cea et al. | |
| 2017/0345904 A1 * | 11/2017 | Clark | H01L 29/161 |
| 2017/0373162 A1 * | 12/2017 | Cheng | H01L 21/823431 |
| 2018/0006159 A1 * | 1/2018 | Guillorn | H01L 21/76889 |
| 2018/0090582 A1 | 3/2018 | Adusumilli et al. | |
| 2019/0131411 A1 * | 5/2019 | Chew | H01L 29/513 |
| 2019/0341448 A1 * | 11/2019 | Bourjot | H01L 29/7853 |
| 2020/0006525 A1 * | 1/2020 | Crum | H01L 29/42392 |
| 2020/0013900 A1 * | 1/2020 | Carr | H01L 29/78618 |
| 2020/0035808 A1 * | 1/2020 | Bao | H01L 29/0847 |
| 2020/0075738 A1 * | 3/2020 | Zang | H01L 29/785 |
| 2020/0091145 A1 * | 3/2020 | Guha | H01L 21/82346 |
| 2020/0091288 A1 * | 3/2020 | Lee | H01L 29/6656 |
| 2020/0119002 A1 * | 4/2020 | Xie | H01L 29/66795 |

* cited by examiner

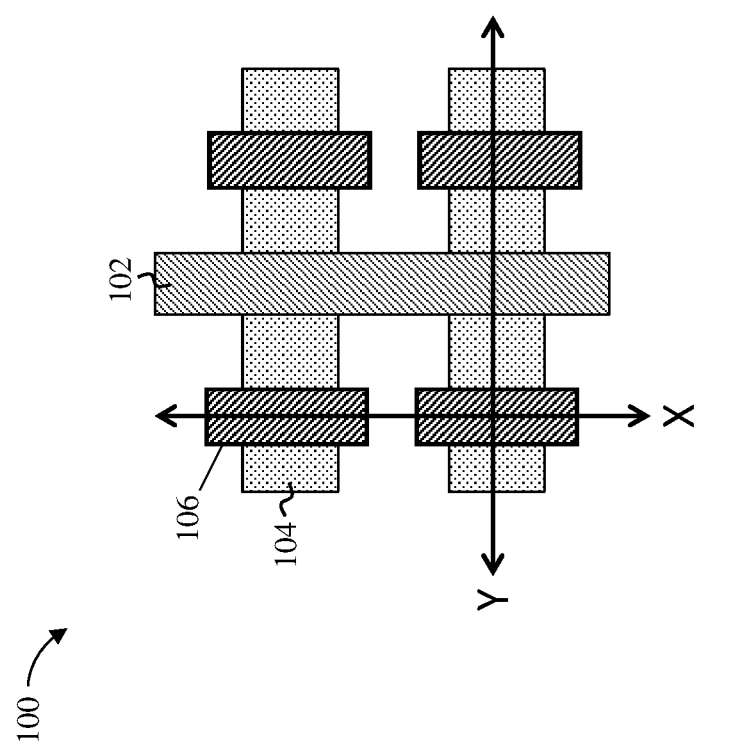

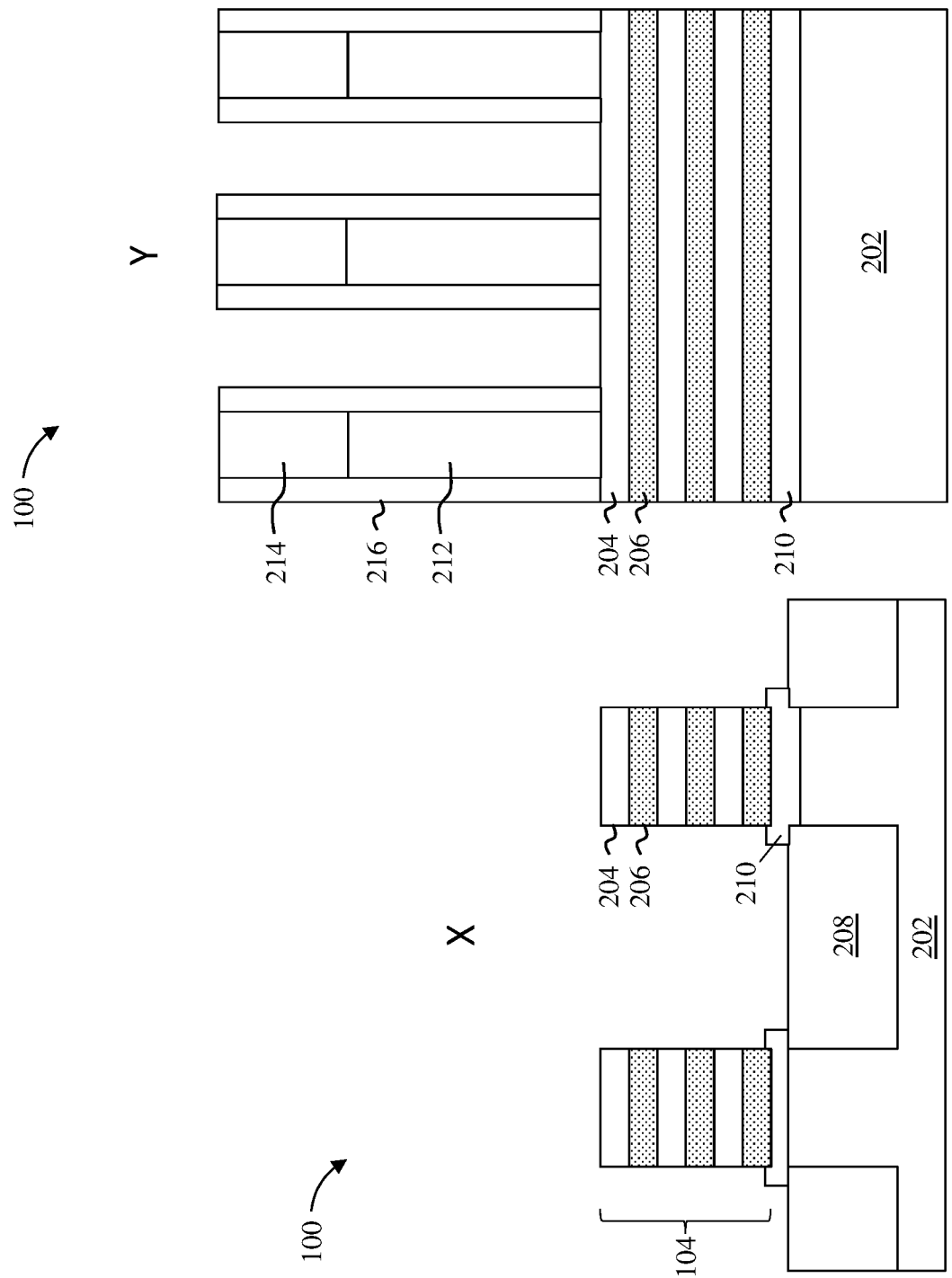

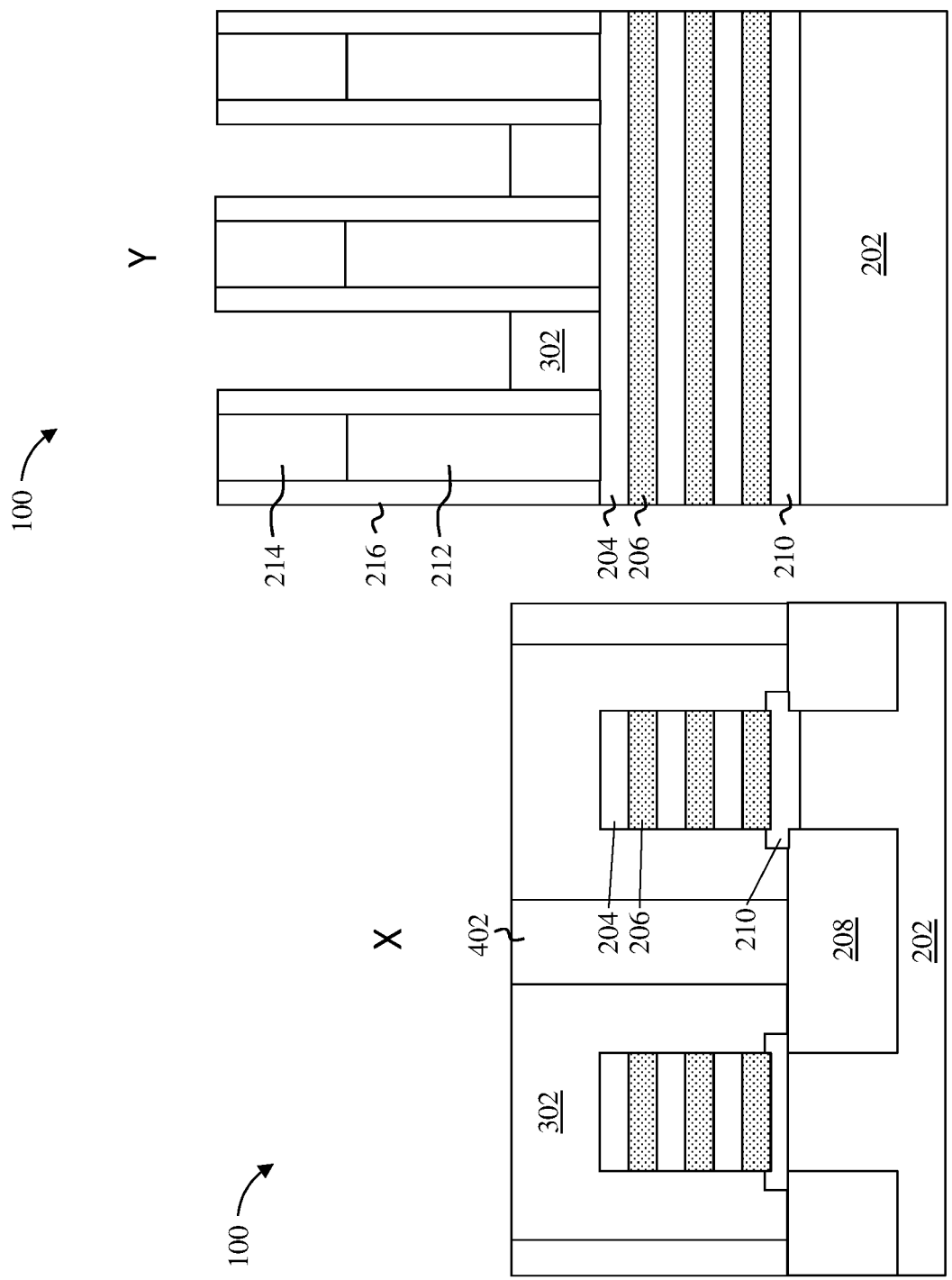

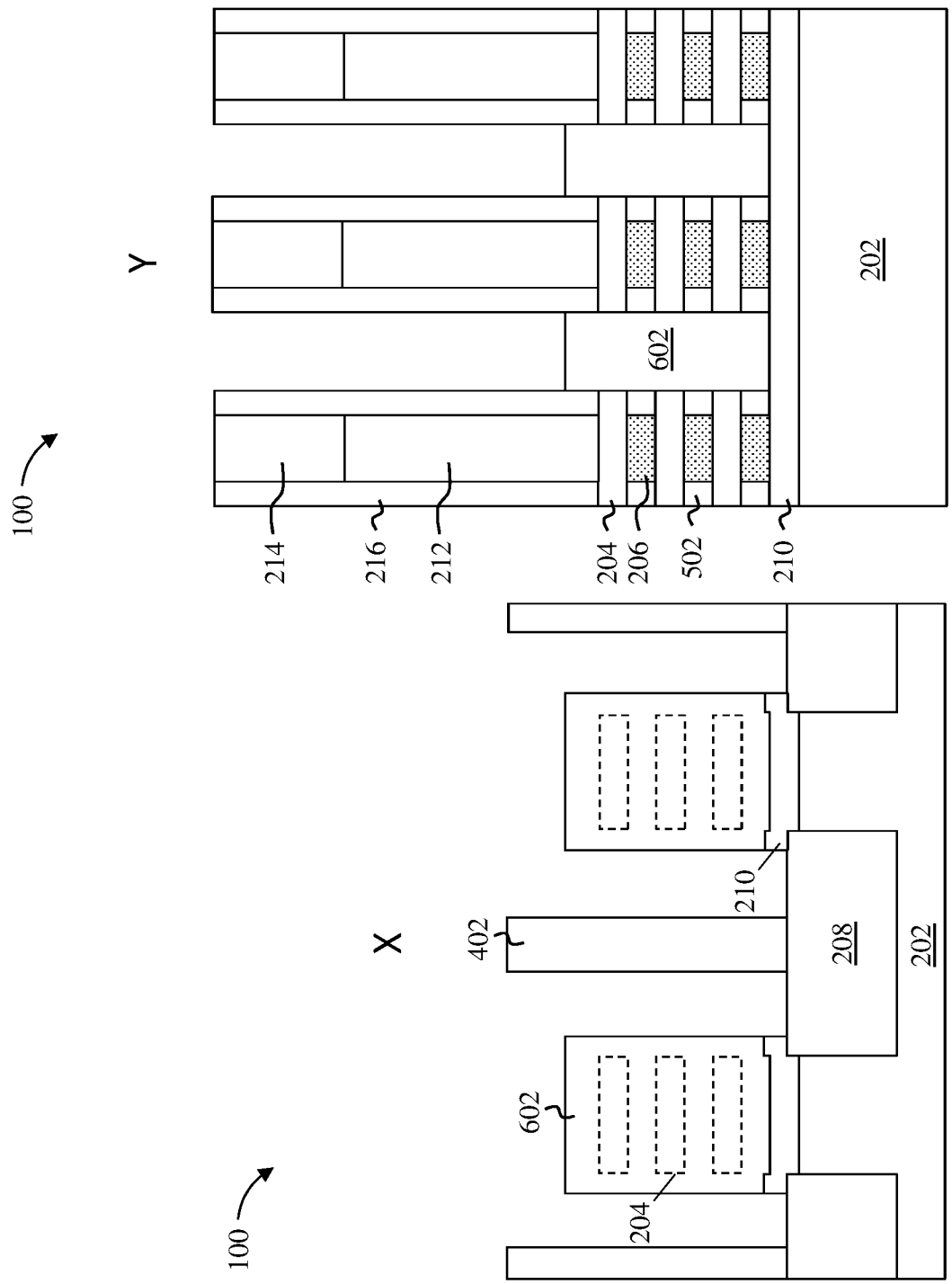

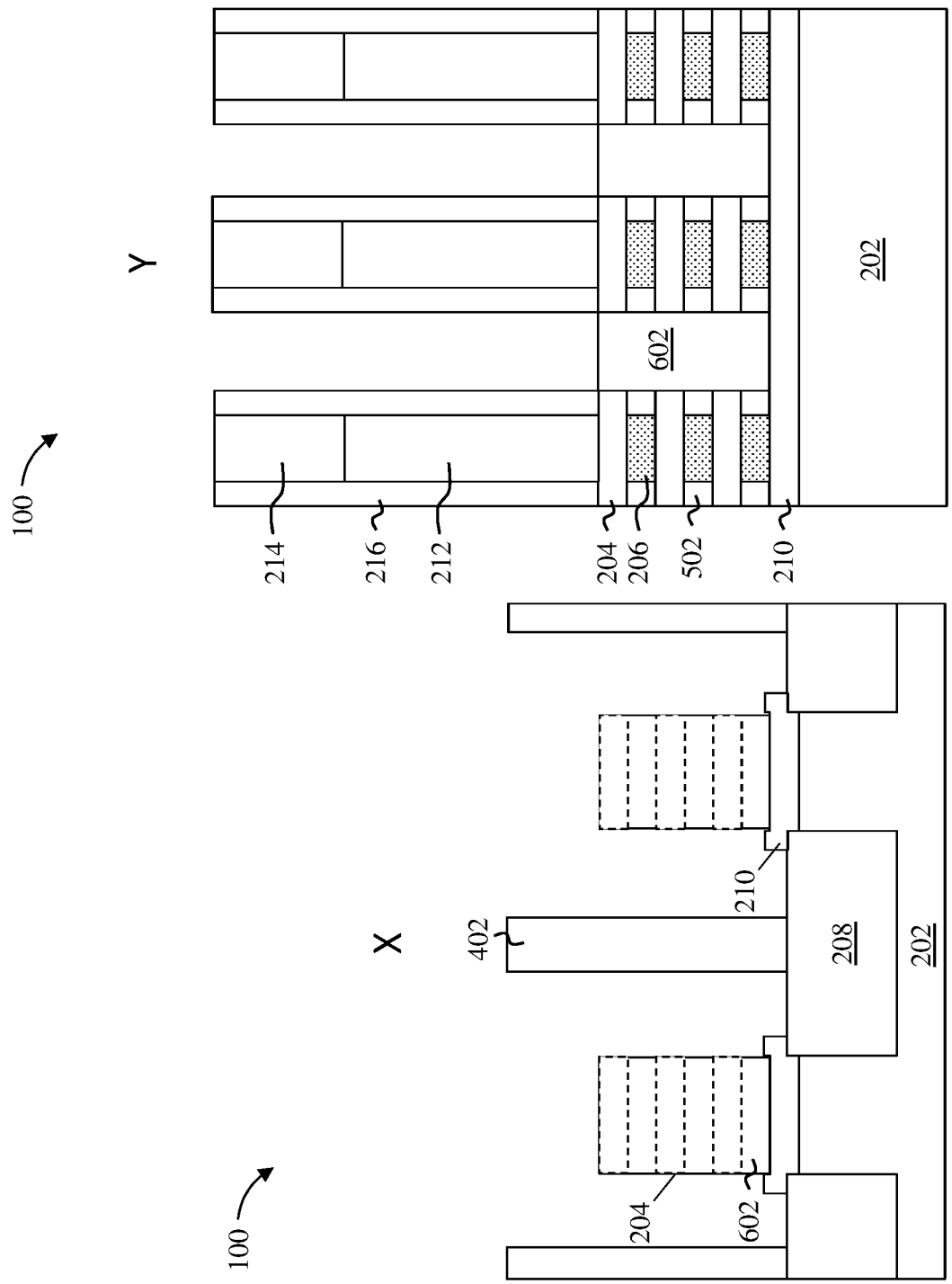

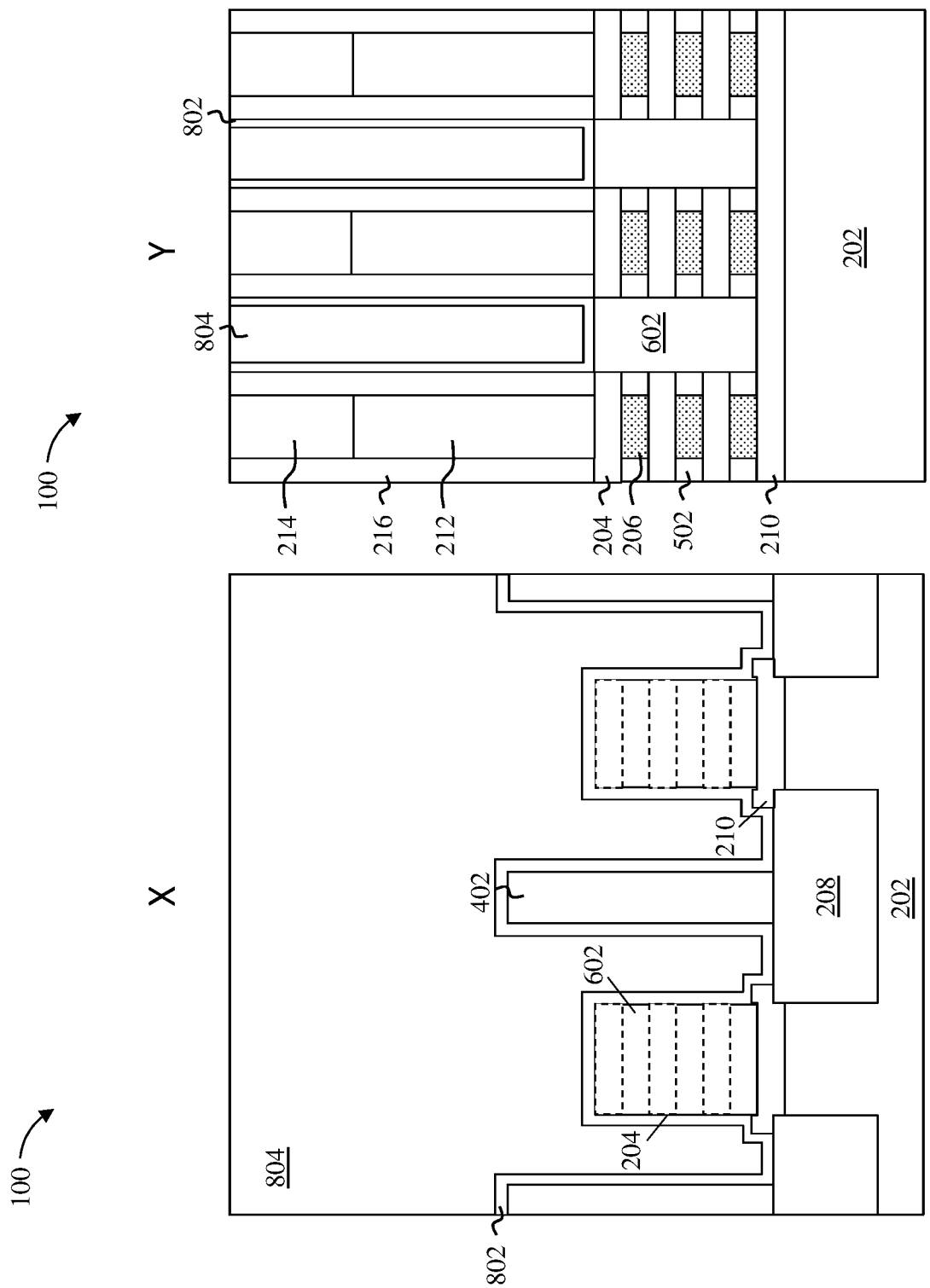

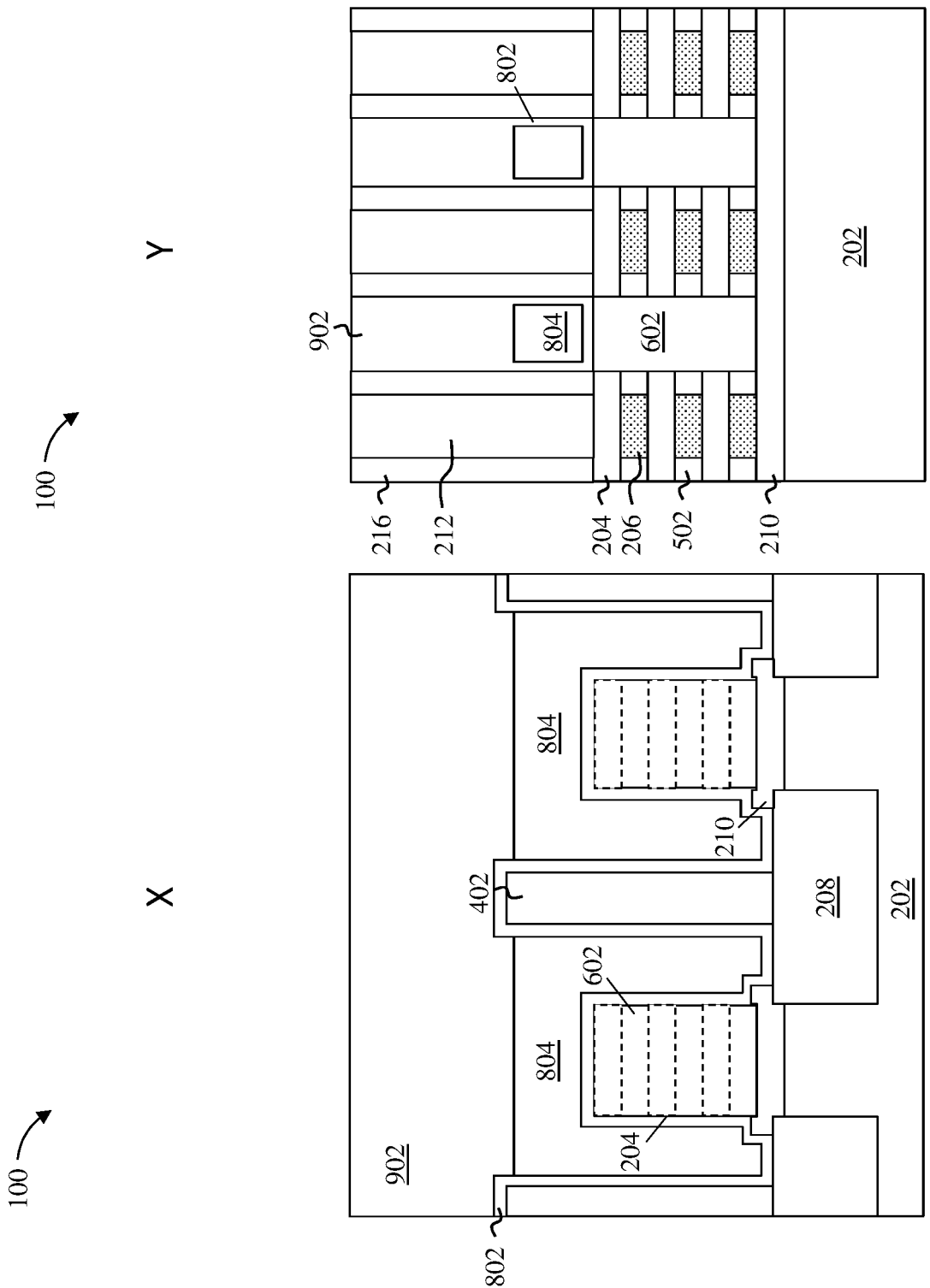

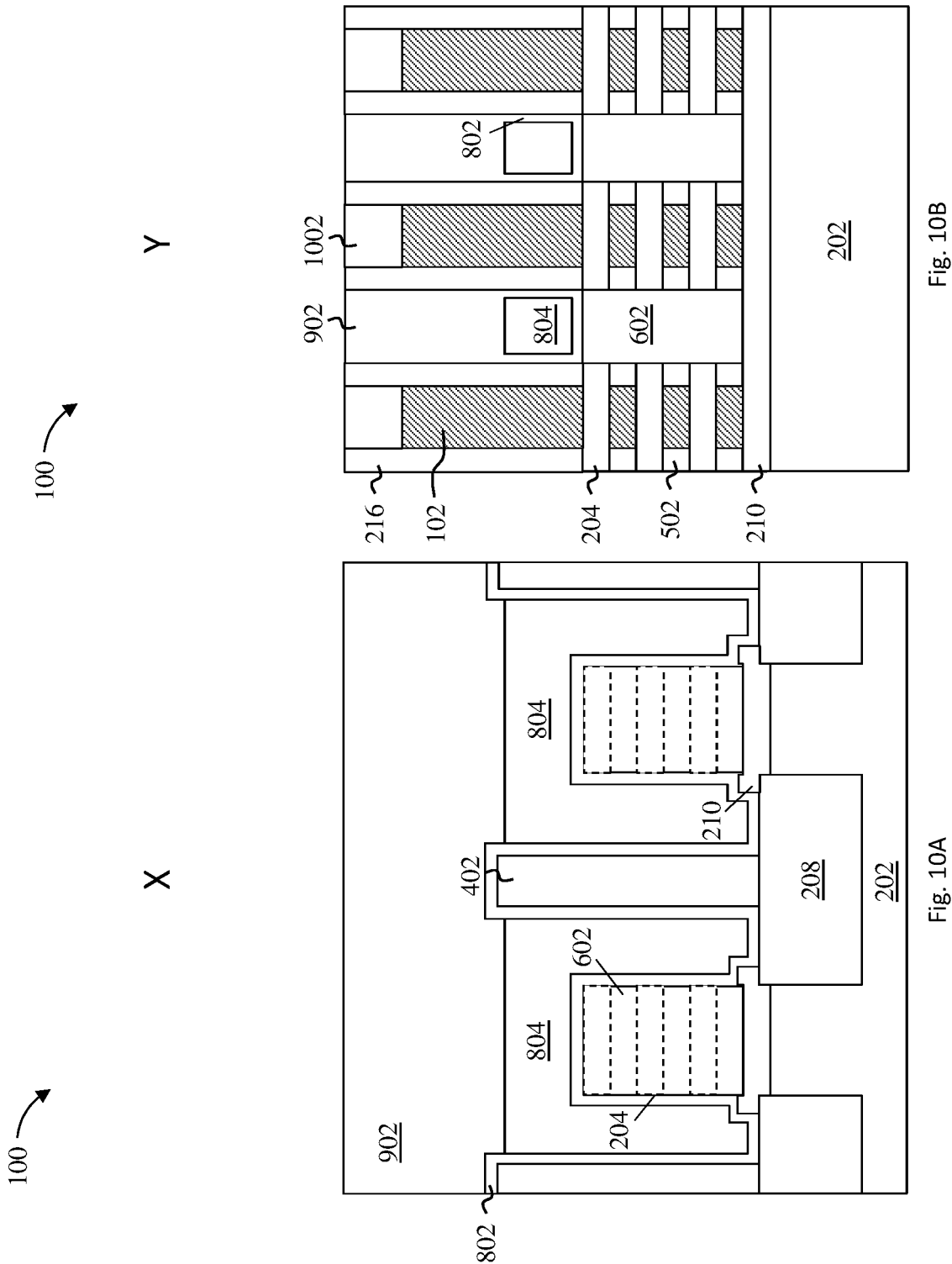

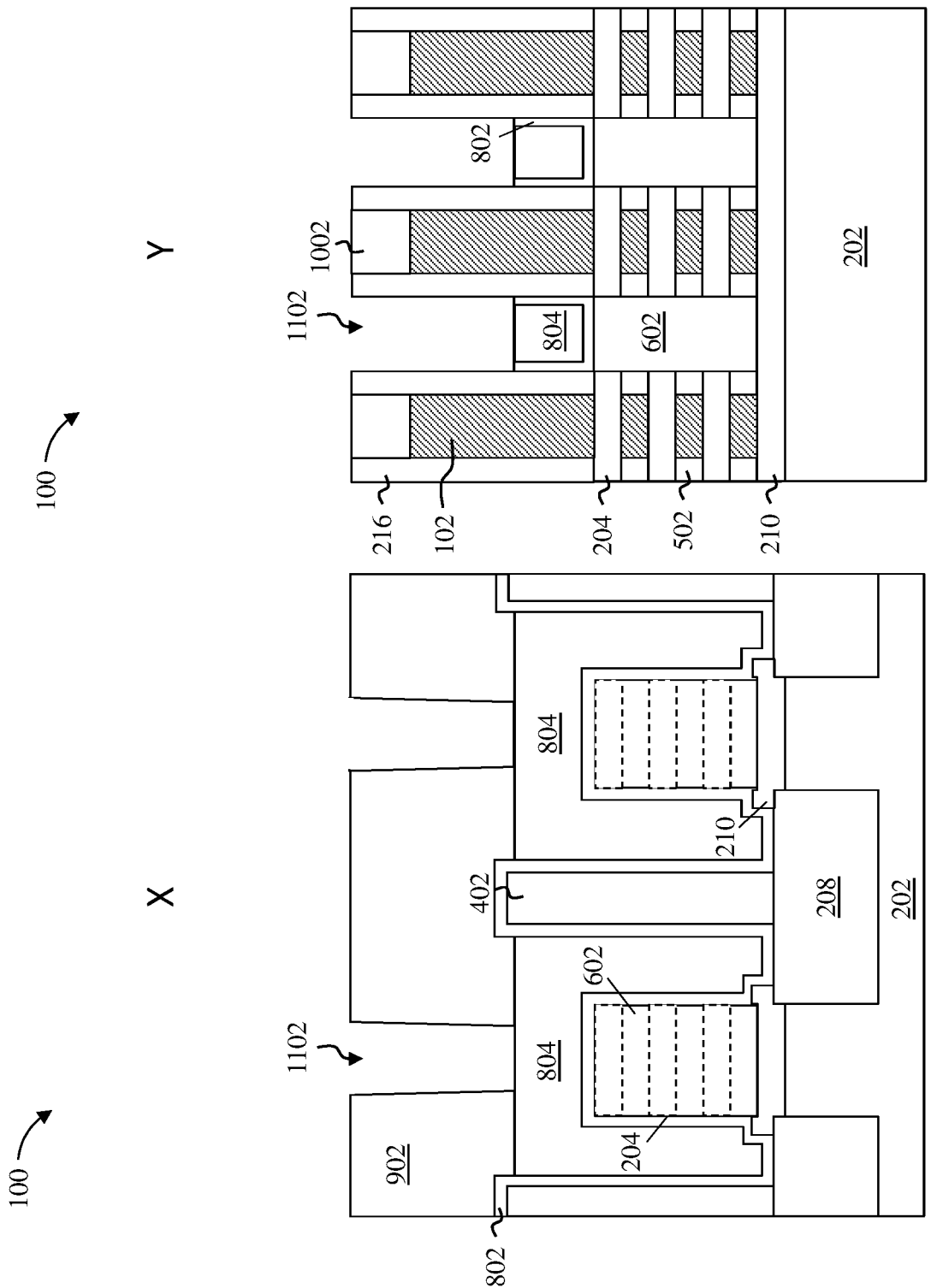

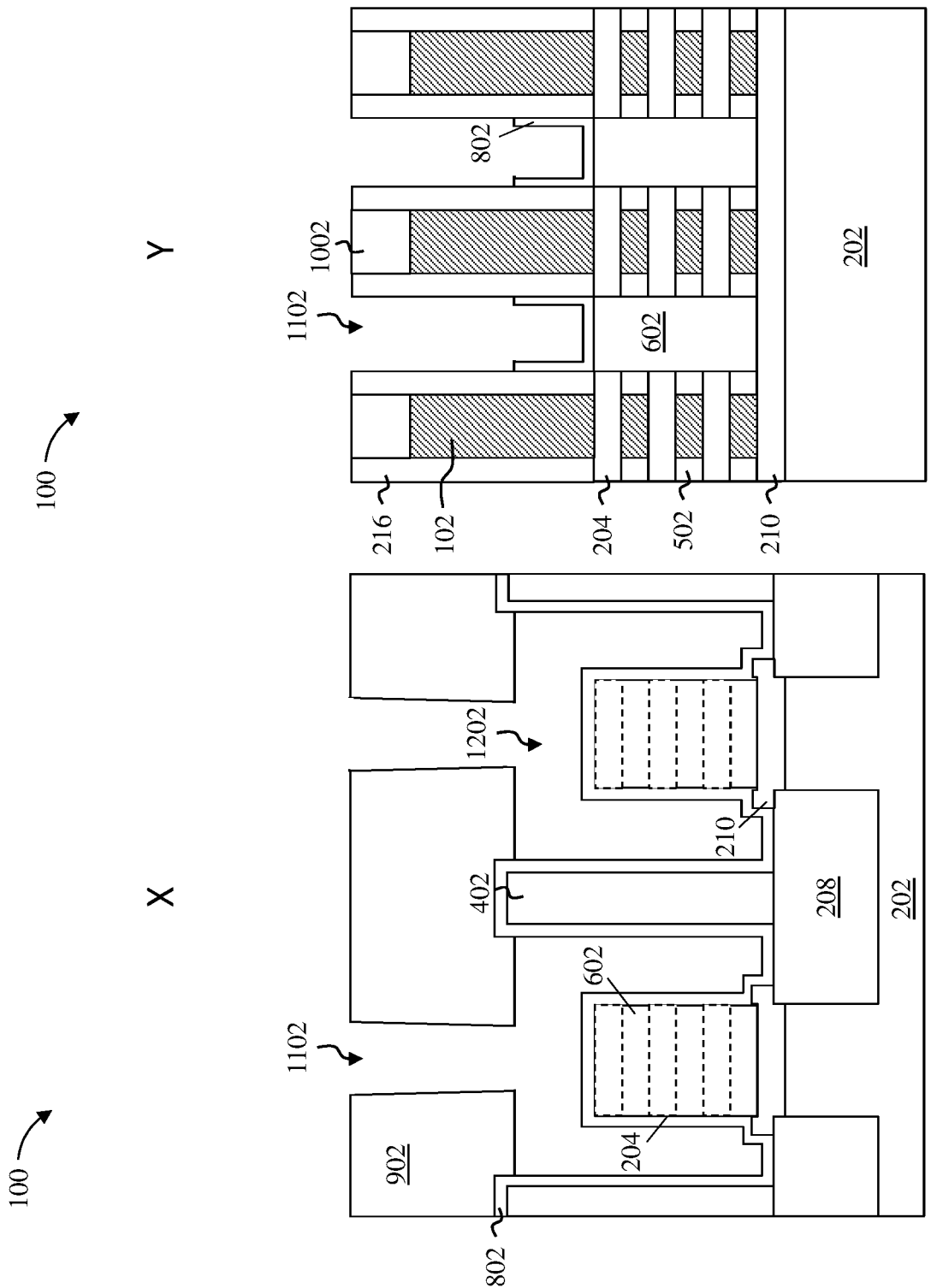

FORMING A RELIABLE WRAP-AROUND CONTACT WITHOUT SOURCE/DRAIN SACRIFICIAL REGIONS

BACKGROUND

The present invention generally relates to fabrication methods and resulting structures for semiconductor devices, and more specifically, to forming a reliable wrap-around contact (WAC) without using an epitaxially grown source/drain sacrificial region.

Traditional metal oxide semiconductor field effect transistor (MOSFET) fabrication techniques include process flows for constructing planar field effect transistors (FETs). A planar FET includes a substrate (also referred to as a silicon slab), a gate formed over the substrate, source and drain regions formed on opposite ends of the gate, and a channel region near the surface of the substrate under the gate. The channel region electrically connects the source region to the drain region while the gate controls the current in the channel. The gate voltage controls whether the path from drain to source is an open circuit ("off") or a resistive path ("on").

In recent years, research has been devoted to the development of nonplanar transistor architectures such as the fin-type field effect transistor (finFET) and the nanosheet field effect transistor (NSFET). In a finFET, a gate runs along sidewalls and a top surface of a channel portion of a semiconductor fin. In a NSFET, a gate wraps around the full perimeter of each nanosheet in a nanosheet stack. These non-planar architectures enable a fuller depletion in the channel region and reduce short-channel effects due to steeper subthreshold swing (SS) and smaller drain induced barrier lowering (DIBL) than planar devices.

SUMMARY

Embodiments of the invention are directed to a method for forming a reliable wrap-around contact (WAC) without using an epitaxially grown source or drain (S/D) sacrificial region. A non-limiting example of the method includes forming an isolation structure over a substrate. A S/D region is formed over the substrate and between sidewalls of the isolation structure. A liner is formed over the S/D region and a sacrificial region is formed over the liner. The sacrificial region can be recessed below a surface of the isolation structure and an interlayer dielectric can be formed over the recessed surface of the sacrificial region. The sacrificial region can be replaced with a wrap-around contact.

Embodiments of the invention are directed to a method for forming a reliable WAC without using an epitaxially grown S/D sacrificial region. A non-limiting example of the method includes forming a liner over a S/D region and forming a sacrificial region over the liner. The sacrificial region is removed to form a cavity exposing a surface of the liner. A wrap-around contact is formed in the cavity. The wrap-around contact can be positioned on sidewalls of the S/D region.

Embodiments of the invention are directed to a semiconductor structure. A non-limiting example of the semiconductor device includes a shallow trench isolation region on a surface of a substrate. The semiconductor device can include a bottom isolation structure on the substrate. The bottom isolation structure can include a raised end portion on a surface of the shallow trench isolation region. The semiconductor device can include a top isolation structure on the surface of the shallow trench isolation region and a S/D region on the bottom isolation structure and between sidewalls of the top isolation structure. A wrap-around contact is positioned between sidewalls of the S/D region and the sidewalls of the top isolation structure. The wrap-around contact can include a first portion on a surface of the raised end portion of the bottom isolation structure and a second portion on the surface of the shallow trench isolation.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 1 depicts a top-down view of a semiconductor structure after a processing operation according to one or more embodiments of the invention;

FIG. 2A depicts a cross-sectional view of the semiconductor structure shown in FIG. 1 along the line X after a processing operation according to one or more embodiments of the invention;

FIG. 2B depicts a cross-sectional view of the semiconductor structure shown in FIG. 1 along the line Y after a processing operation according to one or more embodiments of the invention;

FIG. 4A depicts a cross-sectional view of the semiconductor structure shown in FIG. 1 along the line X after a processing operation according to one or more embodiments of the invention;

FIG. 4B depicts a cross-sectional view of the semiconductor structure shown in FIG. 1 along the line Y after a processing operation according to one or more embodiments of the invention;

FIG. 6A depicts a cross-sectional view of the semiconductor structure shown in FIG. 1 along the line X after a processing operation according to one or more embodiments of the invention;

FIG. 6B depicts a cross-sectional view of the semiconductor structure shown in FIG. 1 along the line Y after a processing operation according to one or more embodiments of the invention;

FIG. 7A depicts a cross-sectional view of the semiconductor structure shown in FIG. 1 along the line X after a processing operation according to one or more embodiments of the invention;

FIG. 7B depicts a cross-sectional view of the semiconductor structure shown in FIG. 1 along the line Y after a processing operation according to one or more embodiments of the invention;

FIG. 8A depicts a cross-sectional view of the semiconductor structure shown in FIG. 1 along the line X after a processing operation according to one or more embodiments of the invention;

FIG. 8B depicts a cross-sectional view of the semiconductor structure shown in FIG. 1 along the line Y after a processing operation according to one or more embodiments of the invention;

FIG. 9A depicts a cross-sectional view of the semiconductor structure shown in FIG. 1 along the line X after a processing operation according to one or more embodiments of the invention;

FIG. 9B depicts a cross-sectional view of the semiconductor structure shown in FIG. 1 along the line Y after a processing operation according to one or more embodiments of the invention;

FIG. 10A depicts a cross-sectional view of the semiconductor structure shown in FIG. 1 along the line X after a processing operation according to one or more embodiments of the invention;

FIG. 10B depicts a cross-sectional view of the semiconductor structure shown in FIG. 1 along the line Y after a processing operation according to one or more embodiments of the invention;

FIG. 11A depicts a cross-sectional view of the semiconductor structure shown in FIG. 1 along the line X after a processing operation according to one or more embodiments of the invention;

FIG. 11B depicts a cross-sectional view of the semiconductor structure shown in FIG. 1 along the line Y after a processing operation according to one or more embodiments of the invention;

FIG. 12A depicts a cross-sectional view of the semiconductor structure shown in FIG. 1 along the line X after a processing operation according to one or more embodiments of the invention;

FIG. 12B depicts a cross-sectional view of the semiconductor structure shown in FIG. 1 along the line Y after a processing operation according to one or more embodiments of the invention;

Figures 3A, 3B:
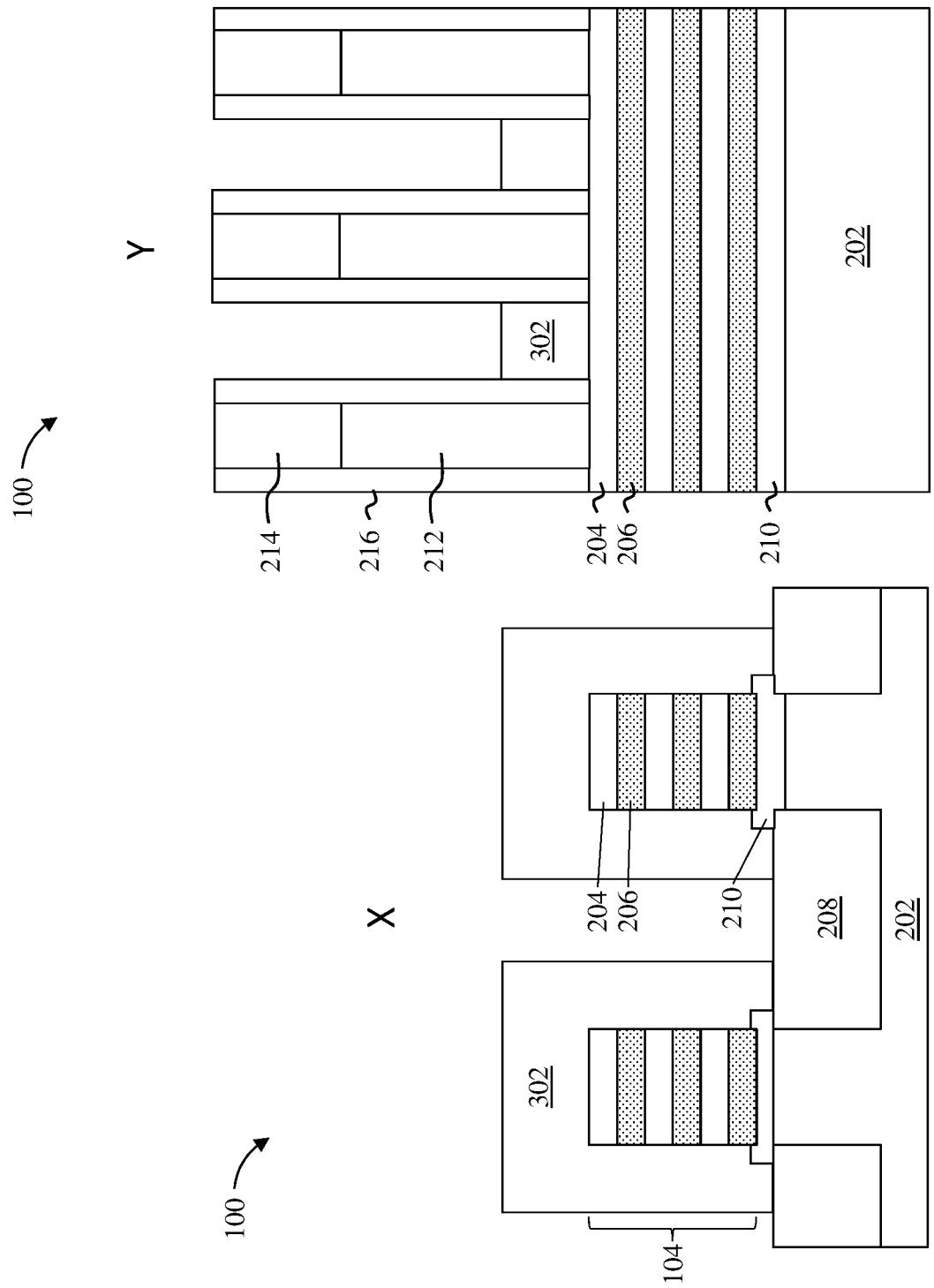
FIG. 3A depicts a cross-sectional view of the semiconductor structure shown in FIG. 1 along the line X after a processing operation according to one or more embodiments of the invention.
FIG. 3B depicts a cross-sectional view of the semiconductor structure shown in FIG. 1 along the line Y after a processing operation according to one or more embodiments of the invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, as next gen non-planar transistor technologies continue to scale, source/drain epitaxy widths continue to shrink. Moreover, source/drain epitaxy heights are becoming relatively taller (while the actual heights can decrease, the ratio of the epitaxy height to width is increasing). Consequently, the landing surface area (contact area) of conventional source/drain contacts is shrinking. This can result in contact misalignments, dead or partially dead devices, and lower device yields. To compensate, some processes have increased the size of the source/drain contact to maximize the possible contact area. While larger contact sizes ensure a larger contact area, larger contacts also result in a higher parasitic capacitance to the gate and increases the risk of contact tip to tip shorts.

Still other processes replace the source/drain contact with a so-called wrap-around contact (WAC) that surrounds the source/drain epitaxy. WACs are typically formed using an epitaxially grown sacrificial region (sometimes referred to as a "sacrificial epitaxy") that is removed to form a trench. The trench is then filled with the WAC material. While WACs increase the contact area, the use of sacrificial epitaxies can be problematic because epitaxial growth on the source/drain surface is hard to control. Sacrificial epitaxies are epitaxially grown from a surface of the source/drain epitaxy diamonds, which are already prone to many variations and defects. As a result, sacrificial epitaxial growth processes experience a very high process variation, and achieving a uniform sacrificial epitaxy growth on a source/drain epitaxy is very difficult. Another issue with sacrificial epitaxies grown on a source/drain is epitaxy diffusion and decreased thermal stability in the final structure.

Turning now to an overview of aspects of the present invention, one or more embodiments of the invention address the above-described shortcomings of the prior art by providing a new semiconductor structure and a method for forming a reliable WAC without using an epitaxially grown source/drain sacrificial region. Instead, a sacrificial region is grown over the device channel, for example, the nanosheet stack in a NSFET. The sacrificial region allows an isolation structure to be formed over the substrate. After the nanosheet stack is recessed, the source/drain can be formed within the isolation structure. A liner and sacrificial material are formed over the source/drain. The liner (e.g., oxide liner) protects the source/drain from diffusion and thermal stability issues. A source/drain contact trench is formed over the source/drain, exposing a surface of the sacrificial material. The sacrificial material is then removed to form a WAC trench, which is filled with the WAC material. While this process is described in detail with respect to a NSFET, the process can be easily adapted for other non-planar architectures. For example, in a finFET configuration the sacrificial region is formed over the fin (equivalent to the nanosheet stack in the NSFET configuration) and the fin is recessed prior to forming the source/drain within the isolation structure. The process then continues similarly.

Turning now to a more detailed description of aspects of the present invention, FIG. 1 depicts a top-down view of a semiconductor structure 100 during an intermediate operation of a method of fabricating a final semiconductor device according to one or more embodiments of the invention. In embodiments of the invention, the final semiconductor device can be a variety of types of MOSFETs, including, for example, non-planar n-type field effect transistors (NFET) and p-type field effect transistors (PFET). For example, the final semiconductor device can be an n-type or p-type NSFET or finFET. In the embodiment shown in FIG. 1, the semiconductor structure 100 includes one or more gates 102 formed over channel regions of one or more nanosheet stacks 104. The semiconductor structure 100 can also include one or more trench silicides 106.

As best shown in FIGS. 2A and 2B, the nanosheet stacks 104 are formed on a substrate 202. The nanosheet stacks 104 can be formed on the substrate 202 using known FEOL NSFET fabrication techniques. For example, the nanosheet stacks 104 can include one or more semiconductor layers 204 alternating with one or more sacrificial layers 206. In some embodiments of the invention, the semiconductor layers 204 and the sacrificial layers 206 are epitaxially grown films.

For ease of discussion reference is made to operations performed on and to nanosheet stacks having three nanosheets alternating with three sacrificial layers (as depicted in FIG. 2A). It is understood, however, that the nanosheet stack 104 can include any number of nanosheets alternating with a corresponding number of sacrificial layers. For example, the nanosheet stack can include a single nanosheet, two nanosheets, four nanosheets, five nanosheets, eight nanosheets, or any number of nanosheets, along with a corresponding number of sacrificial layers (i.e., as appropriate to form a nanosheet stack having a bottommost sacrificial layer under a bottommost nanosheet and a sacrificial layer between each pair of adjacent nanosheets).

The semiconductor layers 204 can be made of any suitable material, such as, for example, monocrystalline Si or silicon germanium (SiGe). In some embodiments of the invention, the semiconductor layers 204 are silicon germanium layers having a germanium concentration of about 10 to about 80 percent. In some embodiments of the invention, the semiconductor layers 204 have a thickness of about 4 nm to about 10 nm, for example 6 nm, although other thicknesses are within the contemplated scope of the invention.

In some embodiments of the invention, the sacrificial layers 206 can be made of silicon or silicon germanium. The material of the sacrificial layers 206 can be selected to provide etch selectivity with respect to the semiconductor layers 204. For example, the sacrificial layers 206 can be silicon layers when the semiconductor layers 204 are SiGe layers, and SiGe layers when the semiconductor layers 204 are silicon layers. In some embodiments of the invention, the sacrificial layers 206 are silicon germanium layers having a germanium concentration of about 10 to about 80 percent. In some embodiments of the invention, the sacrificial layers 206 have a thickness of about 4 nm to about 15 nm, for example 10 nm, although other thicknesses are within the contemplated scope of the invention.

The substrate 202 can be made of any suitable semiconductor material, such as, for example, monocrystalline Si, silicon germanium (SiGe), III-V compound semiconductor, II-VI compound semiconductor, or semiconductor-on-insulator (SOI). Group III-V compound semiconductors, for example, include materials having at least one group III element and at least one group V element, such as one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys.

In some embodiments of the invention, the substrate 202 can include a buried oxide layer (not depicted). The buried oxide layer can be made of any suitable dielectric material, such as, for example, a silicon oxide. In some embodiments of the invention, the buried oxide layer is formed to a thickness of about 145 nm, although other thicknesses are within the contemplated scope of the invention. As best shown in FIG. 2A, in some embodiments of the invention, the semiconductor structure 100 can be electrically isolated from other regions of the substrate 202 by shallow trench isolation (STI) regions 208.

Figures 13A, 13B:
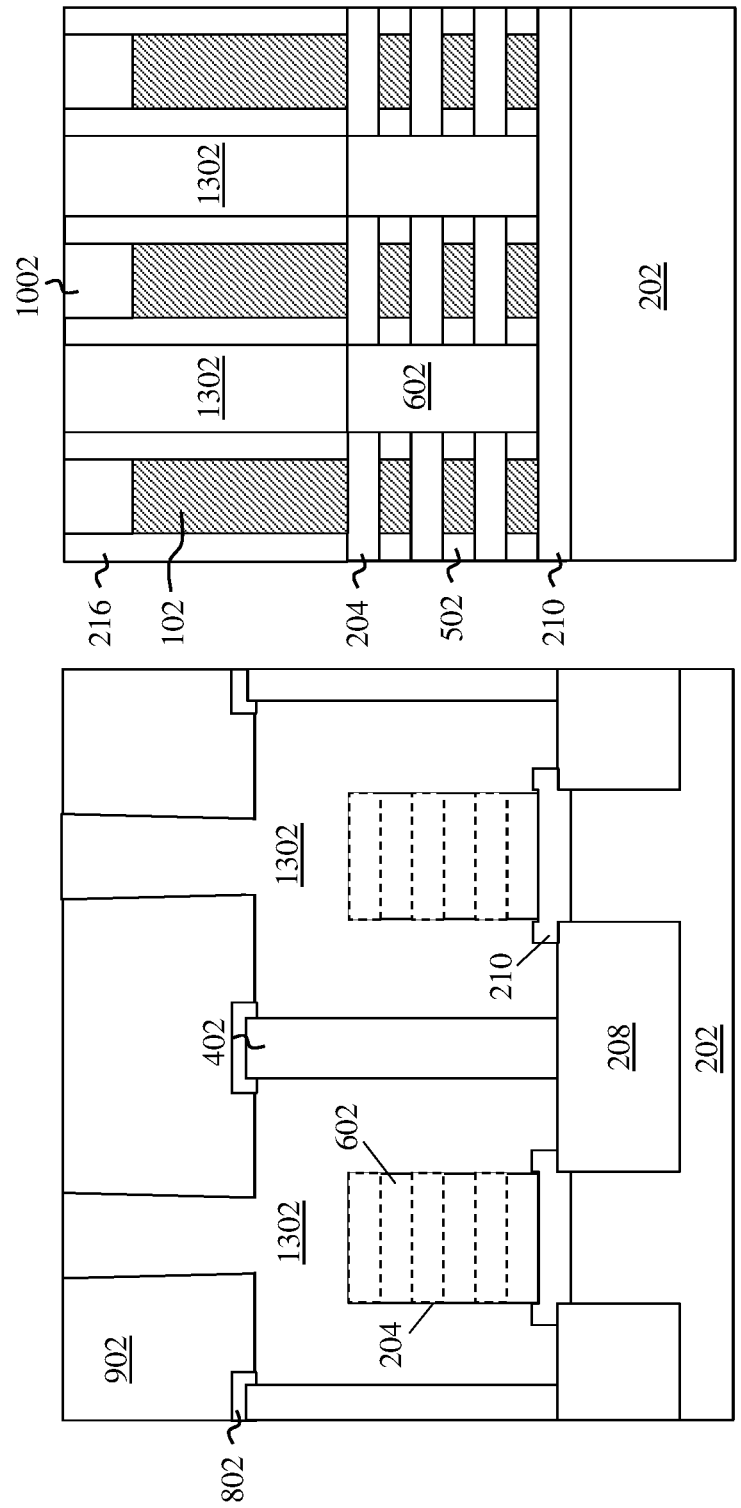
FIG. 13A depicts a cross-sectional view of the semiconductor structure shown in FIG. 1 along the line X after a processing operation according to one or more embodiments of the invention.
FIG. 13B depicts a cross-sectional view of the semiconductor structure shown in FIG. 1 along the line Y after a processing operation according to one or more embodiments of the invention.

As depicted in FIG. 2A, the semiconductor structure 100 can include an isolation layer 210 (also referred to as a bottom isolation structure) formed between the nanosheet stacks 104 and the substrate 202. The isolation layer 210 can be made of any suitable dielectric material, such as, for example, a low-k dielectric, a nitride, silicon nitride, silicon oxide, SiON, SiC, SiOCN, or SiBCN. In some embodiments of the invention, the isolation layer 210 includes silicon nitride or SiBCN. The isolation layer 210 can be formed to a thickness of about 5 to 40 nm, although other thicknesses are within the contemplated scope of the invention. In some embodiments of the invention, the isolation layer 210 includes raised end portions formed on a surface of the STI regions 208. The raised end portions serve as an additional dielectric barrier, preventing a short between the substrate 202 and the WAC 1302 (as depicted in FIG. 13A).

As further depicted in FIG. 2A, the semiconductor structure 100 can also include one or more sacrificial gates 212 formed over the nanosheet stacks 104. The sacrificial gates 212 can include a gate hard mask 214 and gate spacers 216.

The sacrificial gates 212 can be made of any suitable material, such as, for example, amorphous silicon or polysilicon. Any known method for patterning a sacrificial gate (also known as a dummy gate) can be used, such as, for example, a wet etch, a dry etch, or a combination of sequential wet and/or dry etches. In some embodiments of the invention, the gate hard mask 214 is formed on the sacrificial gates 212 and the sacrificial gates 212 are patterned using a wet or dry etch process by selectively removing portions of the sacrificial gates 212 which are not covered by the gate hard masks 214. The gate hard masks 214 can be made of any suitable material, such as, for example, a silicon nitride. In some embodiments, second hard masks (not depicted) are formed on the gate hard masks 214, to form a bilayer hard mask. In some embodiments, the second hard masks include an oxide, such as, for example, silicon dioxide.

In some embodiments of the invention, the gate spacers 216 (also known as sidewall spacers or gate spacers) are formed on sidewalls of the sacrificial gates 212. In some embodiments of the invention, the gate spacers 216 are formed using a chemical vapor deposition (CVD), plasma-enhanced CVD (PECVD), ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), atomic layer deposition (ALD), physical vapor deposition (PVD), chemical solution deposition, molecular beam epitaxy (MBE), or other like process in combination with a wet or dry etch process. For example, spacer material can be conformally deposited over the semiconductor structure 100 and selectively removed using a RIE to form the gate spacers 216. The gate spacers 216 can be made of any suitable material, such as, for example, a low-k dielectric, a nitride, silicon nitride, silicon oxide, SiON, SiC, SiOCN, or SiBCN. In some embodiments of the invention, the gate spacers 216 include silicon nitride. The gate spacers 216 can be formed to a thickness of about 5 to 40 nm, although other thicknesses are within the contemplated scope of the invention.

FIGS. 3A and 3B depict cross-sectional views of the semiconductor structure 100 taken along the lines X and Y of FIG. 1 after a processing operation according to one or more embodiments of the invention. As illustrated in FIG. 3A, a sacrificial region 302 can be formed over the nanosheet stacks 104.

In some embodiments of the invention, the sacrificial region 302 can be epitaxially grown on exposed surfaces of the nanosheet stacks 104. For example, the sacrificial region 302 can be epitaxially grown from exposed surfaces of the semiconductor layers 204 and/or the sacrificial layers 206. In some embodiments of the invention, the sacrificial region 302 is conformally epitaxially grown over the nanosheet stacks 104 ("conformal" epitaxy growth refers to the fact that the sacrificial region 302 can be epitaxially grown to a same nominal thickness from each exposed surface of the nanosheet stacks 104). In some embodiments of the invention, the sacrificial region 302 is formed to a thickness of about 4 nm to about 50 nm, for example 20 nm, although other thicknesses are within the contemplated scope of the invention.

The sacrificial region 302 can be epitaxially grown using, for example, vapor-phase epitaxy (VPE), molecular beam epitaxy (MBE), liquid-phase epitaxy (LPE), or other suitable processes. The sacrificial region 302 can include semiconductor materials epitaxially grown from gaseous or liquid precursors. Advantageously, control of the epitaxial growth process is simplified due to a lack of surface defects on the nanosheet stacks 104.

In some embodiments of the invention, the gas source for the epitaxial deposition of semiconductor material includes a silicon containing gas source, a germanium containing gas source, or a combination thereof. For example, a silicon layer can be epitaxially deposited (or grown) from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. A germanium layer can be epitaxially deposited from a germanium gas source that is selected from the group consisting of germane, digermane, halogermane, dichlorogermane, trichlorogermane, tetrachlorogermane and combinations thereof. A silicon germanium alloy layer can be epitaxially formed utilizing a combination of such gas sources. Carrier gases like hydrogen, nitrogen, helium and argon can be used.

In some embodiments of the invention, the sacrificial region 302 is made of silicon germanium. In some embodiments of the invention, the sacrificial region 302 is made of silicon germanium having a germanium concentration of about 10 to about 65 percent, for example, 50 percent, although other germanium concentrations are within the contemplated scope of the invention.

FIGS. 4A and 4B depict cross-sectional views of the semiconductor structure 100 taken along the lines X and Y of FIG. 1 after a processing operation according to one or more embodiments of the invention. As illustrated in FIG. 4A, an interlayer dielectric 402 can be formed over the semiconductor structure 100 between adjacent nanosheet stacks 104. The interlayer dielectric 402 serves as an isolation structure for the nanosheet stacks 104 (sometimes referred to as a top isolation structure).

The interlayer dielectric 402 can be made of any suitable dielectric material, such as, for example, porous silicates, carbon doped oxides, silicon dioxides, silicon nitrides, silicon oxynitrides, silicon carbide (SiC), or other dielectric materials. Any known manner of forming the interlayer dielectric 402 can be utilized, such as, for example, CVD, PECVD, ALD, flowable CVD, spin-on dielectrics, or PVD. In some embodiments of the invention, the interlayer dielectric 402 and the STI regions 208 are made of the same dielectric material, and together define a single continuous dielectric region (isolation structure).

Figures 5A, 5B:
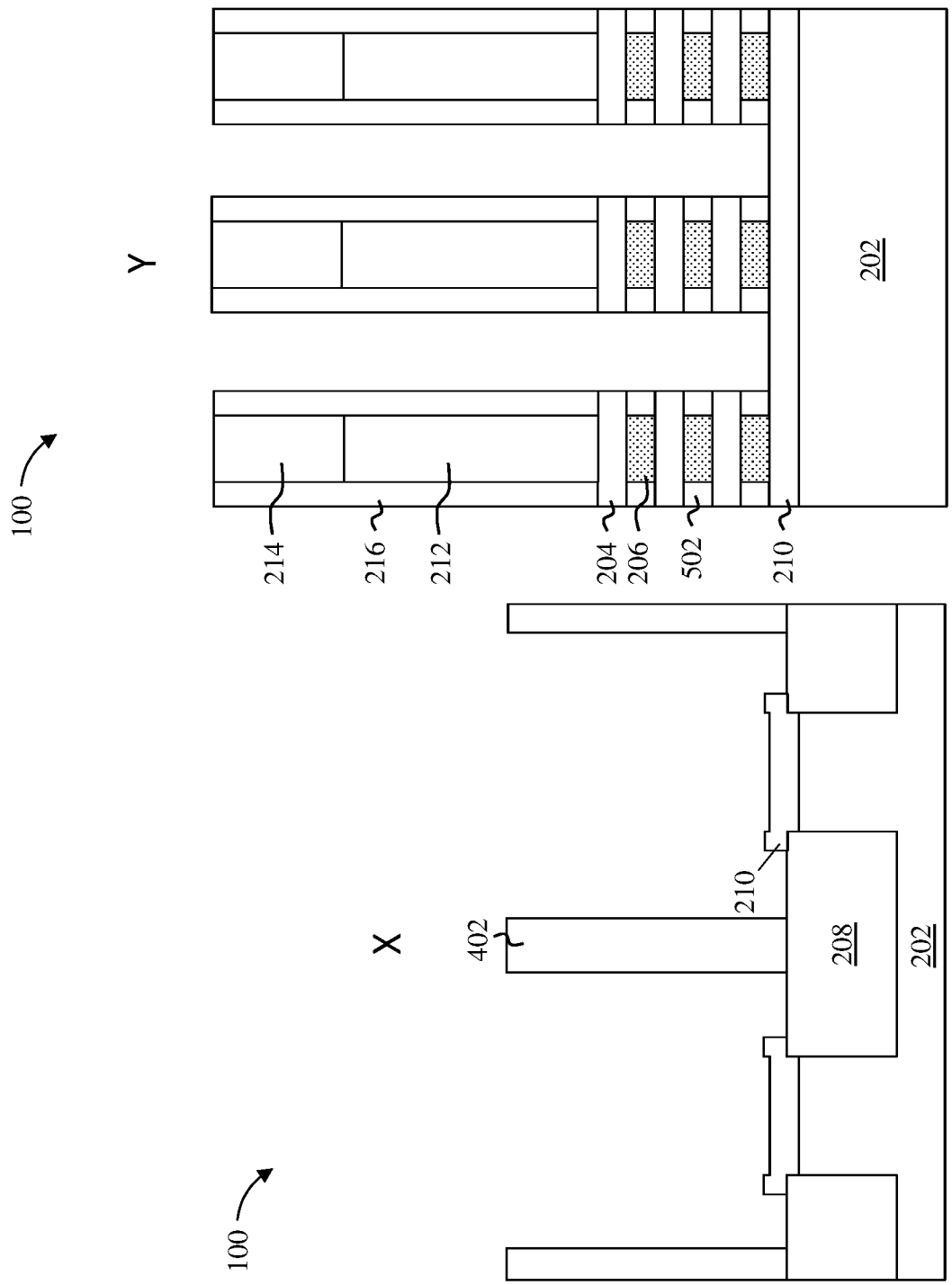
FIG. 5A depicts a cross-sectional view of the semiconductor structure shown in FIG. 1 along the line X after a processing operation according to one or more embodiments of the invention.
FIG. 5B depicts a cross-sectional view of the semiconductor structure shown in FIG. 1 along the line Y after a processing operation according to one or more embodiments of the invention.

FIGS. 5A and 5B depict cross-sectional views of the semiconductor structure 100 taken along the lines X and Y of FIG. 1 after a processing operation according to one or more embodiments of the invention. As illustrated in FIG. 5A, the sacrificial region 302 and the nanosheet stacks 104 can be recessed to expose a surface of the isolation layer 210.

The sacrificial region 302 and the nanosheet stacks 104 can be recessed using any suitable method, such as a wet etch, a dry etch, or a combination of sequential wet and/or dry etches. In some embodiments of the invention, the sacrificial region 302 and the nanosheet stacks 104 are recessed selective to the interlayer dielectric 402, the STI regions 208, and/or the isolation layer 210. For example, silicon can be etched selective to $SiO_2$ using a chlorine plasma etch. In some embodiments of the invention, the sacrificial region 302 and/or the nanosheet stacks 104 are recessed using an anisotropic RIE. In some embodiments of the invention, the anisotropic RIE etches silicon or silicon germanium selective to SiC or SiBCN (i.e., the interlayer dielectric 402).

In some embodiments of the invention, portions of the sacrificial layers 206 are recessed and replaced with inner spacers 502. The sacrificial layers 206 can be recessed using a wet or dry etch, for example, a directional (or lateral) etch selective to the semiconductor layers 204. The inner spacers 502 can be formed using a CVD, PECVD, ALD, PVD, chemical solution deposition, or other like process. The inner spacers 502 can be made of any suitable spacer material, such as, for example, a low-k dielectric, a nitride, silicon nitride, silicon dioxide, SiON, SiC, SiOCN, or SiBCN.

FIGS. 6A and 6B depict cross-sectional views of the semiconductor structure 100 taken along the lines X and Y of FIG. 1 after a processing operation according to one or more embodiments of the invention. As illustrated in FIG. 6A, source/drain regions 602 can be epitaxially grown from exposed surfaces of the nanosheet stacks 104 (the semiconductor layers 204, also referred to as nanosheets, are shown by projection). In some embodiments of the invention, the source and drain regions 206 are formed to a thickness of about 4 nm to about 20 nm, for example 10 nm, although other thicknesses are within the contemplated scope of the invention.

As depicted in FIG. 6A, the source/drain regions 602 can be formed to a thickness sufficient to reach the isolation layer 210, but not the sidewalls of the interlayer dielectric 402. In other words, a cavity or space can remain between the source/drain regions 602 and the interlayer dielectric 402. In some embodiments of the invention, the source/drain regions 602 include an overburden extending past surfaces of the nanosheet stacks 104. The overburden can extend about 10 to about 15 nm from a surface of the nanosheet stacks 104, although other overburden thicknesses are within the contemplated scope of the invention.

The source/drain regions 602 can be epitaxially grown using, for example, VPE, MBE, LPE, or other suitable processes. The source/drain regions 602 can be semiconductor materials epitaxially grown from gaseous or liquid precursors, in a similar manner as the sacrificial region 302. In some embodiments of the invention, the epitaxial semiconductor materials include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

Epitaxially grown silicon and silicon germanium can be doped by adding n-type dopants (e.g., phosphorus or arsenic) or p-type dopants (e.g., Ga, B, BF2, or Al). In some embodiments of the invention, the source/drain regions 602 can be epitaxially formed and doped by a variety of methods, such as, for example, in-situ doped epitaxy (doped during deposition), doped following the epitaxy, or by implantation and plasma doping. The dopant concentration in the doped regions can range from $1 \times 10^{19}$ cm$^{-3}$ to $2 \times 10^{21}$ cm$^{-3}$, or between $1 \times 10^{20}$ cm$^{-3}$ and $1 \times 10^{21}$ cm$^{-3}$.

In some embodiments of the invention, the source/drain regions 602 are made of silicon germanium. In some embodiments of the invention, the source/drain regions 602 are made of silicon germanium having a germanium concentration of about 10 to about 65 percent, for example, 50 percent, although other germanium concentrations are within the contemplated scope of the invention. In some embodiments of the invention, the source/drain regions 602 can extend above a topmost surface of the nanosheet stacks 104.

FIGS. 7A and 7B depict cross-sectional views of the semiconductor structure 100 taken along the lines X and Y of FIG. 1 after a processing operation according to one or more embodiments of the invention. As illustrated in FIG. 7A, in some embodiments of the invention, the source/drain regions 602 are optionally trimmed (conformally recessed) selective to the nanosheet stacks 104. In other words, portions of the source/drain regions 602 (i.e., the overburden) can be removed such that a top surface of the source/drain regions 602 is coplanar to a top surface of the nanosheet stacks 104, and such that sidewalls of the source/drain regions 602 are coplanar to sidewalls of the nanosheet stacks 104. The source/drain regions 602 can be trimmed or recessed using, for example, a wet etch, a dry etch, or a combination of sequential wet and/or dry etches. In some embodiments of the invention, this trimming or recessing process does not occur.

FIGS. 8A and 8B depict cross-sectional views of the semiconductor structure 100 taken along the lines X and Y of FIG. 1 after a processing operation according to one or more embodiments of the invention. As illustrated in FIG. 8A, a liner 802 is formed over the semiconductor structure 100. The liner 802 can mitigate damage to the nanosheet stacks 104 caused by the subsequent interlayer dielectric etch back (depicted in FIG. 9A).

In some embodiments of the invention, the liner 802 is conformally deposited using, for example, ALD, although other conformal deposition processes are within the contemplated scope of the invention. The liner 802 can be made of any suitable material, such as, for example, a low-k dielectric, a nitride, silicon nitride, SiON, SiC, SiOCN, or SiBCN. In some embodiments of the invention, the liner 802 includes a silicon oxide (e.g., SiO$_2$). The liner 802 can be formed to a nominal (conformal) thickness of about 5 nm or less, or 3 nm or less, although other thicknesses are within the contemplated scope of the invention.

As further depicted in FIG. 8A, the remaining space between the isolation structure (e.g., between opposite sidewalls of the interlayer dielectric 402) can be filled with a sacrificial region 804. The sacrificial region 804 can be formed or deposited over the liner 802 using, for example, CVD, PECVD, ALD, flowable CVD, spin-on dielectrics, PVD, or any other suitable deposition process. In some embodiments of the invention, a material of the sacrificial region 804 can be selected to ensure etch selectivity with respect to the liner 802. For example, the sacrificial region 804 can include amorphous silicon or silicon germanium, which can be etched selective to silicon oxide.

FIGS. 9A and 9B depict cross-sectional views of the semiconductor structure 100 taken along the lines X and Y of FIG. 1 after a processing operation according to one or more embodiments of the invention. As illustrated in FIG. 9A, the sacrificial region 804 can be recessed below a top surface of the interlayer dielectric 402.

In some embodiments of the invention, an interlayer dielectric 902 is formed over the recessed surface of the sacrificial region 804. The interlayer dielectric 902 can be made of any suitable dielectric material, such as, for example, porous silicates, carbon doped oxides, silicon dioxides, silicon nitrides, silicon oxynitrides, silicon carbide (SiC), or other dielectric materials. Any known manner of forming the interlayer dielectric 902 can be utilized, such as, for example, CVD, PECVD, ALD, flowable CVD, spin-on dielectrics, or PVD. In some embodiments of the invention, the interlayer dielectric 902 and the liner 802 are made of the same dielectric material, and together define a single continuous dielectric region.

In some embodiments of the invention, the semiconductor structure 100 is planarized to a surface of the sacrificial gates 212 (i.e., below a surface of the gate hard mask 214). The semiconductor structure 100 can be planarized using, for example, a chemical-mechanical planarization (CMP) process.

FIGS. 10A and 10B depict cross-sectional views of the semiconductor structure 100 taken along the lines X and Y of FIG. 1 after a processing operation according to one or more embodiments of the invention. As illustrated in FIG. 10B, the sacrificial layers 206 and the sacrificial gates 212 can be removed and replaced with the gates 102.

The gates 102 can be high-k metal gates (HKMGs) formed over a channel region of the nanosheet stacks 104 using, for example, known replacement metal gate (RMG) processes, or so-called gate-first processes. As used herein, the "channel region" refers to the portion of the semiconductor layers 204 over which the gates 102 are formed, and through which a current passes from source to drain in the final device (not shown). The gates 102 can include a gate dielectric(s) (not shown) and a work function metal stack (not shown). In some embodiments, the gates 102 includes a main body formed from bulk conductive gate material(s).

In some embodiments of the invention, the gate dielectric is a high-k dielectric film formed on a surface (sidewall) of the semiconductor layers 204. The high-k dielectric film can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments of the invention, the high-k dielectric film can have a thickness of about 0.5 nm to about 4 nm. In some embodiments of the invention, the high-k dielectric film includes hafnium oxide and has a thickness of about 1 nm, although other thicknesses are within the contemplated scope of the invention.

In some embodiments of the invention, the gates 102 include one or more work function layers (sometimes referred to as a work function metal stack) formed between the high-k dielectric film and a bulk gate material. In some embodiments of the invention, the gates 102 include one or more work function layers, but do not include a bulk gate material.

If present, the work function layers can be made of, for example, aluminum, lanthanum oxide, magnesium oxide, strontium titanate, strontium oxide, titanium nitride, tantalum nitride, hafnium nitride, tungsten nitride, molybdenum nitride, niobium nitride, hafnium silicon nitride, titanium aluminum nitride, tantalum silicon nitride, titanium aluminum carbide, tantalum carbide, and combinations thereof. The work function layer can serve to modify the work function of the gates 102 and enables tuning of the device threshold voltage. The work function layers can be formed to a thickness of about 0.5 to 6 nm, although other thicknesses are within the contemplated scope of the invention. In some embodiments of the invention, each of the work function layers can be formed to a different thickness. In some embodiments of the invention, the work function layers include a TiN/TiC/TiCAl stack.

In some embodiments, the gates 102 include a main body formed from bulk conductive gate material(s) deposited over the work function layers and/or gate dielectrics. The bulk gate material can include any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), conductive carbon, graphene, or any suitable combination of these materials. The conductive gate material can further include dopants that are incorporated during or after deposition.

As further depicted in FIG. 10B, the gates 102 can include gate hard masks 1002. The gate hard masks 1002 can be made of any suitable material, such as, for example, silicon nitride. As the gate hard masks 1002 are aligned to between the gate spacers 216, the gate hard masks 1002 can be referred to as self-aligned hard masks (or SAC caps).

FIGS. 11A and 11B depict cross-sectional views of the semiconductor structure 100 taken along the lines X and Y of FIG. 1 after a processing operation according to one or more embodiments of the invention. As illustrated in FIG. 11A, a contact trench 1102 can be formed in the interlayer dielectric 902. The contact trench 1102 can be formed using a wet or dry etch, for example, a RIE. In some embodiments of the invention, the RIE can be selective to the sacrificial region 804 (e.g., selective to a-Si or SiGe, depending on the material selected for the sacrificial region 804). In other words, the RIE can land on an exposed surface of the sacrificial region 804.

FIGS. 12A and 12B depict cross-sectional views of the semiconductor structure 100 taken along the lines X and Y of FIG. 1 after a processing operation according to one or more embodiments of the invention. As illustrated in FIG. 12A, the sacrificial region 804 can be removed to expose a surface of the liner 802.

The sacrificial region 804 can be removed using, for example, a wet etch, a dry etch, or a combination of sequential wet and/or dry etches. For example, in embodiments where the sacrificial region 804 is amorphous silicon, the amorphous silicon can be removed using known etch chemistries, such as by a nitric acid aqueous solution mixed with hydrochloric acid or hydrogen peroxide. In some embodiments of the invention, the sacrificial region 804 is removed selective to the liner 802. In this manner, a WAC cavity 1202 can be formed over the nanosheet stacks 104 without causing a short between adjacent nanosheet stacks 104.

FIGS. 13A and 13B depict cross-sectional views of the semiconductor structure 100 taken along the lines X and Y of FIG. 1 after a processing operation according to one or more embodiments of the invention. As illustrated in FIG. 13A, exposed portions of the liner 802 can be removed to expose a surface and sidewalls of the source/drain regions 602. The liner 802 can be removed using, for example, a wet etch, a dry etch, or a combination of sequential wet and/or dry etches. In some embodiments of the invention, the liner 802 is removed selective to the interlayer dielectric 402, the source/drain regions 602, the isolation layer 210, and/or the STI regions 208.

In some embodiments of the invention, a WAC 1302 can be formed by depositing or forming a conductive material within the contact trench 1102 and the WAC cavity 1202. The WAC 1302 can be formed or deposited using known metallization techniques. In some embodiments of the invention, the WAC 1302 is overfilled above a surface of the interlayer dielectric 902 and then recessed or planarized to a surface of the gate hard masks 1002. The WAC 1302 can be made of any suitable conducting material, such as, for example, metal (e.g., tungsten, titanium, tantalum, ruthenium, zirconium, cobalt, copper, aluminum, platinum), conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. In some embodiments of the invention, the WAC 1302 is a cobalt or tungsten contact. The conductive material can further include dopants that are incorporated during or after deposition. In some embodiments of the invention, the WAC 1302 can include a barrier metal liner (not depicted). Material examples include tantalum nitride and tantalum (TaN/Ta), titanium, titanium nitride, cobalt, ruthenium, and manganese.

In some embodiments of the invention, portions of the liner 802 in contact with the WAC 1302 undergo a silicidation process (not shown). For example, in embodiments where the liner 802 is made of $SiO_2$, the portions of the liner 802 in contact with the WAC 1302 can react with the WAC 1302 metals to form a silicide. As the silicide is self-aligned to the WAC 1302 (the silicide is only formed at the interface between the liner 802 and the WAC 1302), this silicide is sometimes referred to as a silicide.

Figure 14:
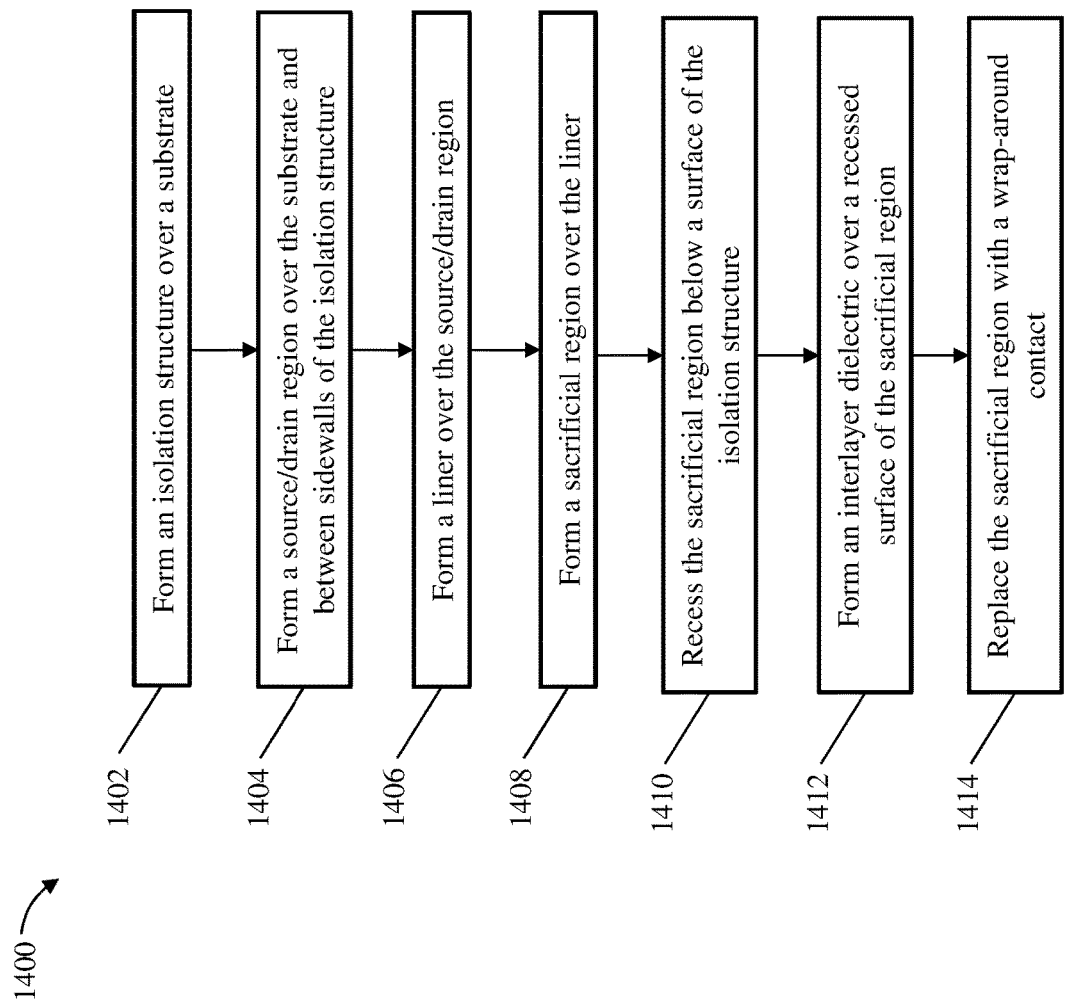
FIG. 14 depicts a flow diagram illustrating a method according to one or more embodiments of the invention.

FIG. 14 depicts a flow diagram 1400 illustrating a method for forming a semiconductor device according to one or more embodiments of the invention. As shown at block 1402, an isolation structure is formed over a substrate. The isolation structure can be formed in a similar manner as the interlayer dielectric 402 (depicted in FIG. 4A). In some embodiments of the invention, the isolation structure is formed on sidewalls of a sacrificial region.

At block 1404, a source/drain region is formed over the substrate and between sidewalls of the isolation structure. In some embodiments of the invention, the source/drain region is formed on a surface of a bottom isolation structure.

At block 1406, a liner is formed over the source/drain region. At block 1408, a sacrificial region is formed over the liner.

At block 1410, the sacrificial region is recessed below a surface of the isolation structure. At block 1412, an interlayer dielectric is formed over a recessed surface of the sacrificial region.

At block 1414, the sacrificial region is replaced with a wrap-around contact. In some embodiments of the invention, the sacrificial region is removed selective to the liner to form a cavity exposing a surface of the liner. In some embodiments of the invention, the wrap-around contact is formed in the cavity and is positioned between sidewalls of the isolation structure and the source/drain region.

The method can further include forming a nanosheet stack (NSFET configuration) or a semiconductor fin (finFET configuration) over the substrate, as previously described herein. In some embodiments of the invention, a bottom isolation is formed between a nanosheet stack and the substrate. In some embodiments of the invention, a sacrificial epitaxy is formed over the nanosheet stack and the nanosheet stack is recessed to expose a surface of the bottom isolation. In some embodiments of the invention, a trench is formed in the interlayer dielectric. The trench exposes a surface of the sacrificial region. In some embodiments of the invention, the source/drain epitaxy is trimmed such that a surface of the source/drain epitaxy is coplanar to a surface of the nanosheet stack.

Figure 15:
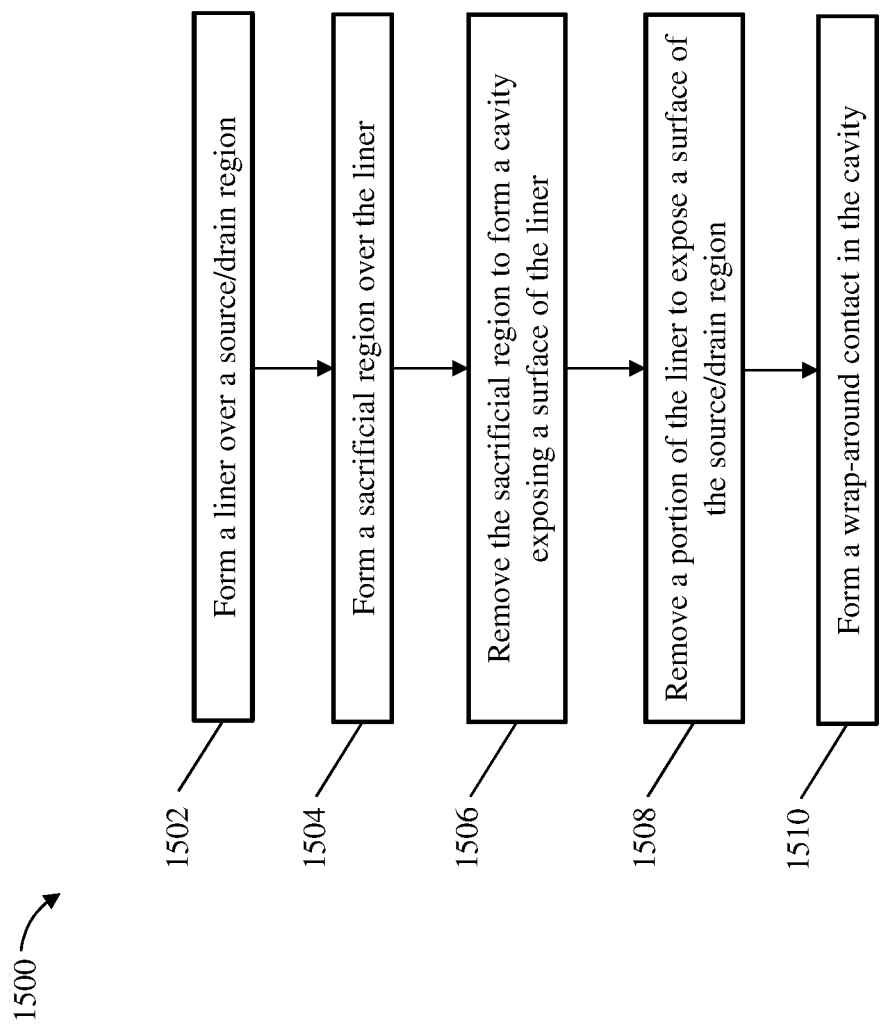
FIG. 15 depicts a flow diagram illustrating a method according to one or more embodiments of the invention.

FIG. 15 depicts a flow diagram 1500 illustrating a method for forming a semiconductor device according to one or more embodiments of the invention. As shown at block 1502, a liner is formed over a source/drain region. The liner can be formed in a similar manner as the liner 802 (depicted in FIG. 8A).

At block 1504, a sacrificial region is formed over the liner. The sacrificial region can be formed in a similar manner as the sacrificial region 804 (depicted in FIG. 8A).

At block 1506, the sacrificial region is removed to form a cavity exposing a surface of the liner. In some embodiments of the invention, the sacrificial region is removed selective to the liner. In some embodiments of the invention, the liner includes a first material, the sacrificial region includes a second material, and the second material can be etched selective to the first material. In some embodiments of the invention, the liner includes silicon oxide and the sacrificial region includes amorphous silicon or silicon germanium. At block 1508, exposed portions of the liner can be removed to expose a surface and sidewalls of the source/drain region.

At block 1510, a wrap-around contact is formed in the cavity. The wrap-around contact can be positioned on a surface and sidewalls of the source/drain region. The wrap-around contact can be formed in a similar manner as the WAC 1302 (depicted in FIG. 13A).

The method can include a silicidation process, whereby a portion of the liner in contact with the wrap-around contact reacts with metal in the wrap-around contact to form a salicide. The method can include forming the source/drain region on a bottom isolation structure of a substrate.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention of the invention, epitaxial growth and/or deposition processes can be selective to forming on semiconductor surface, and may or may not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
    forming an isolation structure over a substrate;
    forming a source or drain (S/D) region over the substrate and between sidewalls of the isolation structure;
        forming a liner over the S/D region;
        forming a sacrificial region over the liner;
        recessing the sacrificial region below a surface of the isolation structure;
    forming an interlayer dielectric over a recessed surface of the sacrificial region; and
    replacing the sacrificial region with a wrap-around contact.

2. The method of claim 1, wherein replacing the sacrificial region comprises:
    removing the sacrificial region to form a cavity exposing a surface of the liner; and
    forming the wrap-around contact in the cavity, the wrap-around contact positioned between sidewalls of the isolation structure and the S/D region.

3. The method of claim 1 further comprising forming a nanosheet stack over the substrate, the nanosheet stack comprising one or more nanosheets.

4. The method of claim 3 further comprising forming a bottom isolation between the nanosheet stack and the substrate.

5. The method of claim 4 further comprising forming the sacrificial region over the nanosheet stack.

6. The method of claim 5 further comprising recessing the nanosheet stack to expose a surface of the bottom isolation.

7. The method of claim 5, wherein the isolation structure is formed on sidewalls of the sacrificial region.

8. The method of claim 4, wherein the S/D region is formed on a surface of the bottom isolation.

9. The method of claim 3 further comprising trimming the S/D region such that a surface of the S/D region is coplanar to a surface of the nanosheet stack.

10. The method of claim 1 further comprising forming a trench in the interlayer dielectric, the trench exposing a surface of the sacrificial region.

11. The method of claim 1, wherein the sacrificial region is removed selective to the liner.

12. A method for forming a semiconductor device, the method comprising:
    forming a liner over a source or drain (S/D) region;
    forming a sacrificial region over the liner;
    removing the sacrificial region to form a cavity exposing a surface of the liner; and
    forming a wrap-around contact in the cavity, the wrap-around contact on sidewalls of the S/D region;
    wherein a portion of the liner in contact with the wrap-around contact undergoes a silicidation process.

13. The method of claim 12, wherein the liner comprises a first material, the sacrificial region comprises a second material, and the second material can be etched selective to the first material.

14. The method of claim 12, wherein the liner comprises silicon oxide and the sacrificial region comprises amorphous silicon or silicon germanium.

15. The method of claim 12 further comprising forming the S/D region on a bottom isolation structure of a substrate.

16. A method for forming a semiconductor device, the method comprising:
    forming a liner over a source or drain (S/D) region;
    forming a sacrificial region over the liner;
    removing the sacrificial region to form a cavity exposing a surface of the liner; and
    forming a wrap-around contact in the cavity, the wrap-around contact on sidewalls of the S/D region;

wherein the liner comprises silicon oxide and the sacrificial region comprises amorphous silicon or silicon germanium.

* * * * *